(12) United States Patent
Kim

(10) Patent No.: US 7,777,259 B2
(45) Date of Patent: Aug. 17, 2010

(54) MULTI-WELL CMOS IMAGE SENSOR AND METHODS OF FABRICATING THE SAME

(75) Inventor: Taek Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 257 days.

(21) Appl. No.: 11/980,628

(22) Filed: Oct. 31, 2007

(65) Prior Publication Data

US 2008/0296641 A1 Dec. 4, 2008

(30) Foreign Application Priority Data

May 29, 2007 (KR) .................... 10-2007-0052225

(51) Int. Cl.
- H01L 31/062 (2006.01)
- H01L 31/113 (2006.01)
- H01L 31/06 (2006.01)
- H01L 21/00 (2006.01)

(52) U.S. Cl. ............ 257/292; 257/291; 257/461; 257/E31.084; 438/48; 438/74

(58) Field of Classification Search ........... 257/213, 257/288–292, 461, E31.084; 438/142–308, 438/48, 74
See application file for complete search history.

(56) References Cited

U.S. PATENT DOCUMENTS

| | | | |
|---|---|---|---|
| 7,002,205 B2 * | 2/2006 | Onishi et al. ............ 257/328 |
| 2005/0040445 A1 * | 2/2005 | Mouli ..................... 257/290 |
| 2007/0052056 A1 * | 3/2007 | Doi et al. ................ 257/462 |

\* cited by examiner

Primary Examiner—Luan C Thai
(74) Attorney, Agent, or Firm—Harness, Dickey & Pierce, PLC

(57) ABSTRACT

Provided is a multi-well CMOS image sensor and a method of fabricating the same. The multi-well CMOS image sensor may include a plurality of photodiodes vertically formed in a region of a substrate, an n+ wall that vertically connects an outer circumference of the photodiodes, and a floating diffusion region that is connected to the photodiodes on a side of the n+ wall to receive charges from the photodiodes, wherein a p-type region is formed between the floating diffusion region and the n+ wall, and the plurality of photodiodes have a multi-potential well structure.

20 Claims, 7 Drawing Sheets

MULTI-WELL CMOS IMAGE SENSOR AND METHODS OF FABRICATING THE SAME

PRIORITY STATEMENT

This application claims priority under 35 U.S.C. §119 to Korean Patent Application No. 10-2007-0052225, filed on May 29, 2007, in the Korean Intellectual Property Office (KIPO), the entire contents of which are incorporated herein by reference.

BACKGROUND

1. Field

Example embodiments relate to a multi-well CMOS (complimentary metal oxide semiconductor) image sensor and a method of fabricating the same.

2. Description of the Related Art

An image sensor is a photoelectric element that transforms detected light into an electrical signal. A conventional image sensor may include a plurality of unit pixels arranged in an array on a semiconductor substrate. Each of the unit pixels may include a photodiode and transistors. When detecting external light, the photodiode may generate and store optical charges and the transistors may output electrical signals according to the charges of the generated optical charges.

A CMOS image sensor may include a photodiode that may store received optical signals and may realize an image using a control device that may control or process optical signals. Because the control device may be manufactured using a CMOS manufacturing technique, the process of manufacturing the CMOS image sensor may be relatively simple, and furthermore, may be formed in one chip including various signal processing devices.

In a conventional CMOS image sensor, the photodiode, which receives light that has passed through a micro-lens and a color filter, may be a pn junction diode. In response to the received light, the photodiode may generate pairs of electrons and holes, and electrons may accumulate in a well due to a potential well. The accumulated electrons may move to a floating diffusion region when a transfer gate is opened, and a voltage may be outputted from the floating diffusion region according to the amount of electrons.

However, the potential well of the photodiode of the conventional CMOS image sensor may be formed to a depth of 0.1 to 1.5 μm from a silicon surface. The practical depth at which light is absorbed in silicon may be different according to the type of light. Blue light may be mostly absorbed on the surface, and the absorption depth may increase as the wavelength of light becomes shorter. In the case of red light, about half of the incident light may be absorbed to a depth of 3 μm. Therefore, if the potential well is formed to a higher depth, the sensitivity of the CMOS image sensor may be increased.

FIG. 1 illustrates a simulation result of a potential energy of a conventional CMOS image sensor. For convenience, a photodiode of the image sensor and a floating diffusion region are depicted only. Referring to FIG. 1, the photodiode, which is an n type potential well, may be formed to a depth of 0.1 to 1.5 μm from a surface of a p type silicon substrate. The contour lines may indicate identical concentration, and the concentration of the n type impurity may increase towards the center. A floating diffusion region, which is an n+ doping region, may be formed on a side of the photodiode. Thus, when a transfer gate is opened, electrons from the photodiode may move to the floating diffusion region where the potential is lower. A first graph G1 indicates the potential of the potential well of FIG. 1, and a second graph G2 indicates the potential when the potential well may be formed to a depth of 2 μm. The potential of the first and second graphs G1 and G2 may increase towards the right-hand side. At the second graph G2 where a relatively deep potential well is formed, the bottom of the potential well may become flat, and thus, electrons and holes formed due to optical absorption may be recombined instead of being separated, so the sensitivity of the image sensor may be reduced.

SUMMARY

Example embodiments provide a multi-well CMOS image sensor including a photodiode having an increased depth. Example embodiments also provide a method of fabricating the multi-well CMOS image sensor.

According to example embodiments, a multi-well CMOS image sensor may include a plurality of photodiodes vertically formed in a region of a substrate, an n+ wall that vertically connects an outer circumference of the photodiodes, and a floating diffusion region that is connected to the photodiodes on a side of the n+ wall to receive charges from the photodiodes, wherein a p-type region may be formed between the floating diffusion region and the n+ wall, and the plurality of photodiodes have a multi-potential well structure.

The plurality of photodiodes may be a pn junction diode having an n-type impurity layer and a p-type impurity layer on each horizontal side of the n-type impurity layer. The n+ wall may surround the outer circumference of the plurality of photodiodes. The plurality of photodiodes may have a depth of about 2 μm or more, for example, 3 μm or more, from the substrate. The p-type region may be a p-type wall formed using an implantation process. The n-type impurity layers may be formed by an ion implantation process.

According to example embodiments, a method of fabricating a multi-well CMOS image sensor may include forming an epitaxial layer in which a plurality of p-type impurity layers and n-type impurity layers are alternately formed on a substrate, forming an n+ wall on an outer circumference of a photodiode region by ion implanting an n+ impurity from an upper side of the epitaxial layer, forming a p-type wall on a side of the n+ wall from a surface of the epitaxial layer by ion implanting p-type conductive ions, and forming a floating diffusion region in the epitaxial layer to be connected to the p-type wall by implanting n++ ions.

The epitaxial layer may be a silicon layer. Forming the n+ wall may include forming the n+ wall that surrounds the outer circumference of the photodiode region. Forming the p-type wall may include forming the p-type wall having a depth greater than that of the n+ wall.

According to example embodiments, a method of fabricating a multi-well CMOS image sensor may include forming a plurality of n-type impurity layers vertically separated from each other in a photodiode region from a surface of a p-type substrate, forming an n+ wall on an outer circumference of the photodiode region by ion implanting an n+ impurity from an upper side of the substrate, and forming a floating diffusion region apart from a side of the n+ wall by implanting n++ ions.

Forming the plurality of n-type impurity layers may include implanting n-type ions. Forming the n+ wall may include forming the n+ wall to be connected to the plurality of n-type impurity layers. Forming the plurality of n-type impurity layers may include forming the n-type impurity layers to a depth of about 2 μm or more, for example, 3 μm or more.

BRIEF DESCRIPTION OF THE DRAWINGS

Example embodiments will be more clearly understood from the following detailed description taken in conjunction with the accompanying drawings. FIG. 1 represents a conventional CMOS image sensor and FIGS. 2-7C represent non-limiting, example embodiments as described herein.

FIG. 1 shows a simulation result of a potential energy of a conventional CMOS image sensor;

FIG. 2 is a plan view of a multi-well CMOS image sensor according to example embodiments;

FIG. 3 is a cross-sectional view taken along line III-III of FIG. 2, according to example embodiments;

FIG. 4 shows potential energy of a multi-well structure of a CMOS image sensor according to example embodiments;

FIG. 5 is an equivalent circuit diagram of a unit pixel of a multi-well CMOS image sensor according to example embodiments;

FIGS. 7A-7C are cross-sectional views illustrating a method of fabricating a multi-well CMOS image sensor according to example embodiments.

Figure 1:
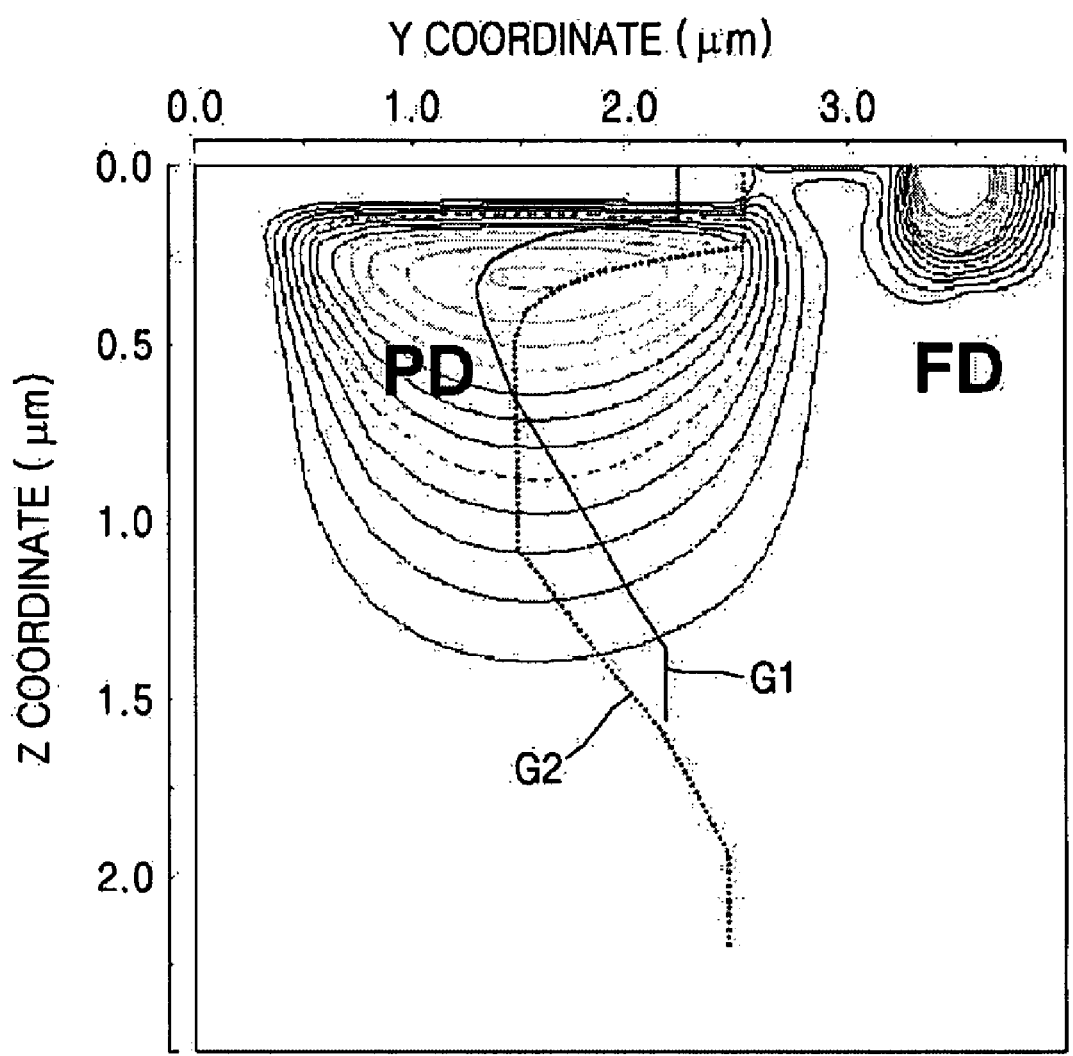

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

A multi-well CMOS image sensor and a method of fabricating the multi-well CMOS image sensor according to example embodiments will now be described more fully with reference to the accompanying drawings in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to one skilled in the art. In the drawings, the thicknesses of layers and regions are exaggerated for clarity. Like numbers refer to like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
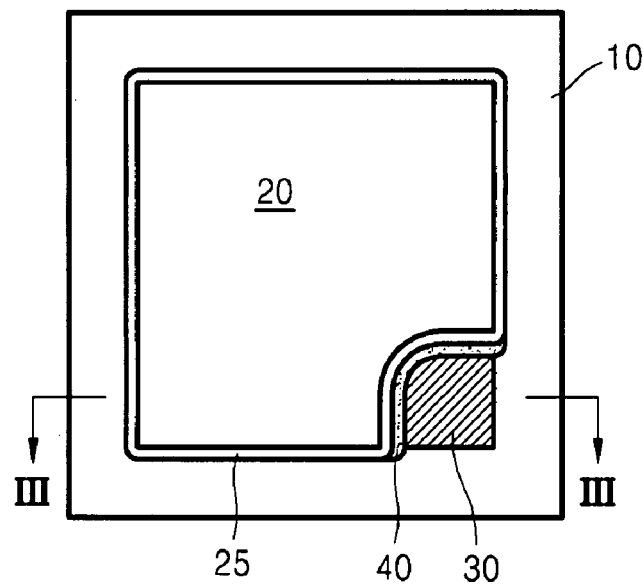
Figure 3:
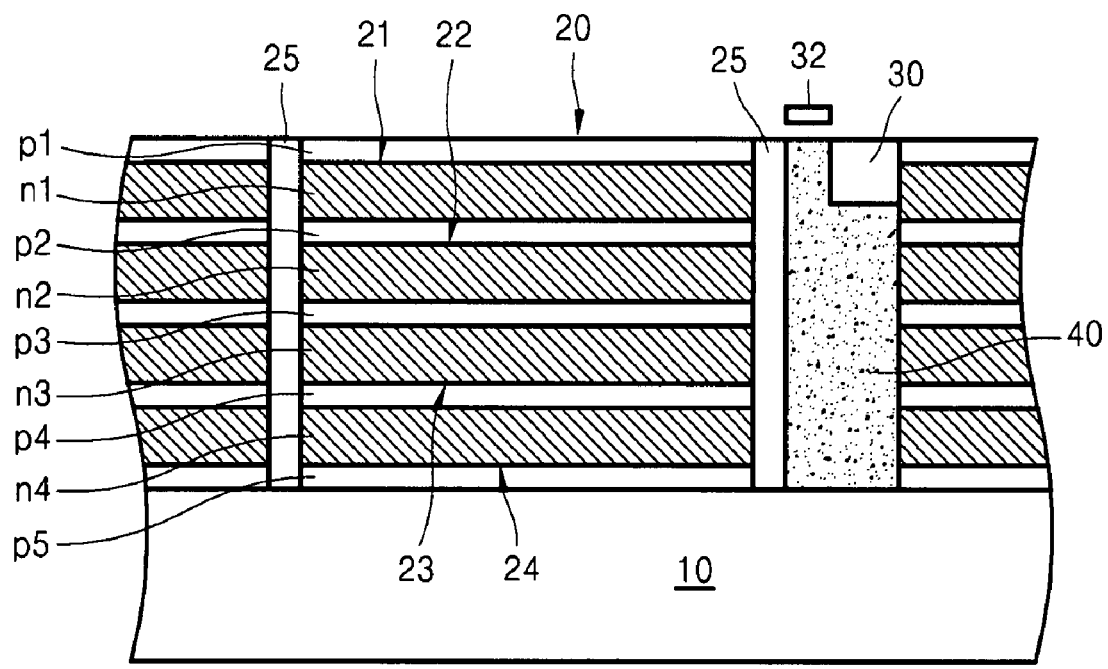

FIG. 2 is a plan view of a multi-well CMOS image sensor according to example embodiments, and FIG. 3 is a cross-sectional view taken along line III-III of FIG. 2. For convenience of explanation, a micro lens, a color filter between the micro lens and a substrate, and wirings may be omitted in the drawings. Referring to FIG. 2, at least one photodiode 20 formed in a multi-well, and a signal processing device (not shown) connected to the photodiode 20, may be formed on a silicon substrate 10. In FIG. 2, for convenience of explanation, only a floating diffusion region of the signal processing device may be shown. The silicon substrate 10 may be a silicon substrate doped with a p-type impurity.

Referring to FIG. 3, p-type impurity layers p1 through p5 and n-type impurity layers n1 through n4 may be alternately formed from the surface of the silicon substrate 10 in the photodiode 20 region of the silicon substrate 10. The at least one photodiode 20 may include first through fourth photodiodes 21 through 24. The first photodiode 21 may include a first n-type impurity layer n1 and a p-type impurity region around the first n-type impurity layer n1, the second photodiode 22 may include a second n-type impurity layer n2 and a p-type impurity region around the second n-type impurity layer n2, the third photodiode 23 may include a third n-type impurity layer n3 and a p-type impurity region around the third n-type impurity layer n3, and the fourth photodiode 24 may include a fourth n-type impurity layer n4 and a p-type impurity region around the fourth n-type impurity layer n4.

A fifth p-type impurity layer p5 may be omitted if the silicon substrate 10 is a p-type silicon substrate. The first through fourth photodiodes 21 through 24 respectively form pn junction diodes. In FIG. 2, the photodiode 20 may include four photodiodes 21 through 24, but it may not be limited thereto. For example, the photodiode 20 may include more than two photodiodes.

Referring to FIGS. 2 and 3, an n+ wall 25 may be formed perpendicularly to the silicon substrate 10 on an outer circumference of the photodiode 20. The n+ wall 25 may be connected to the first through fourth n-type impurity layers n1 through n4 of the first through fourth photodiodes 21 through 24. The n+ wall 25 may be a region where electrons gathered in the first through fourth photodiodes 21 through 24 are collected, and may have a potential energy lower than that of the first through fourth photodiodes 21 through 24.

A floating diffusion region 30 doped with an n++ impurity may be formed on the surface of the silicon substrate 10 on a side of the photodiode 20. A p-type wall 40 may be formed between the photodiode 20 and the floating diffusion region 30. The floating diffusion region 30 may be formed on a surface of the p-type wall 40. The p-type wall 40 may be naturally formed if the silicon substrate 10 is a p-type substrate and the floating diffusion region 30, the photodiode 20, and the n+ wall 25 have been respectively formed prior to the p-type wall. In FIG. 2, the n+ wall 25 may completely surround the photodiode region, but example embodiments may not be limited thereto. For example, the n+ wall 25 may be formed only on a region between the photodiode 20 and the p-type wall 40. The n+ wall 25, the p-type wall 40, and the floating diffusion region 30 may be formed using an ion implantation process.

Figure 4:
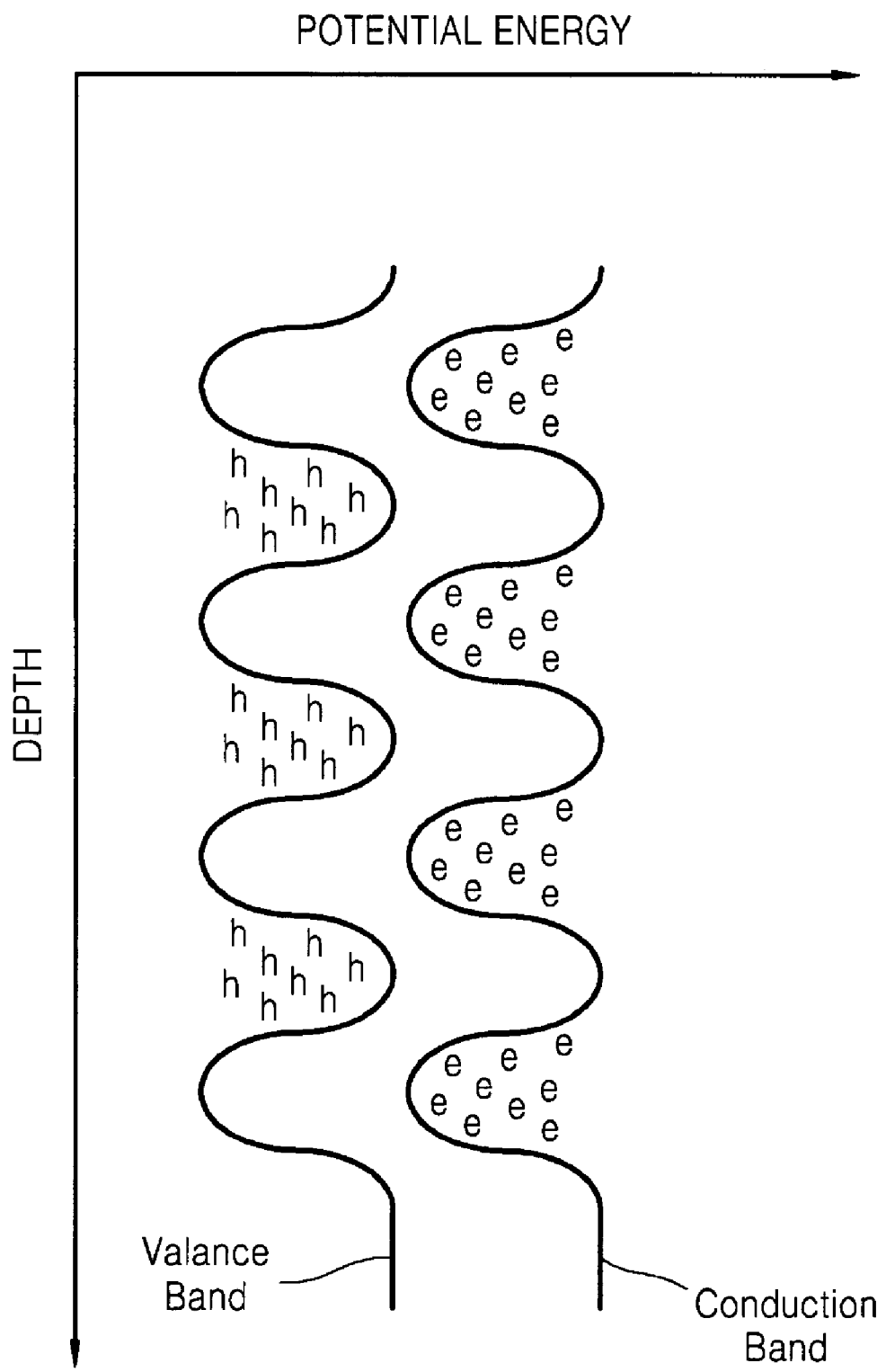

The photodiode 20 may have a potential energy as schematically depicted in FIG. 4. In FIG. 4, a horizontal axis indicates potential energy, and a vertical axis indicates depth from the surface of the photodiode 20. Referring to FIG. 4, the photodiode 20 may have four potential wells, for example, a multi-well structure. Electrons and holes generated in the photodiode 20 due to light may be respectively collected in the potential wells formed in a conduction band and a valance band, for example, the electrons and the holes may be separately stored. Thus, there may be relatively little possibility that the electrons and the holes may be consumed due to re-combination. As the number of the potential wells increases, the depth of the photodiode 20 may be deeper. Accordingly, light having a relatively short wavelength, for example, red light, may be mostly absorbed, thereby increasing light sensitivity.

The photodiode 20 may be formed to have a depth of about 3 μm or more. At this depth, the silicon substrate 10 has an absorption rate of about 50% for red light having a relatively short wavelength. The photodiode 20 may be formed to a depth of about 10 μm in order to increase the absorption rate to about 90% or more for red light. The n+ wall 25 may be formed by implanting an n-type impurity from the surface of the silicon substrate 10. Because the n+ wall 25 has a potential energy lower than that of the first through fourth n-type impurity layers n1 through n4 of the photodiode 20, electrons gathered in the first through fourth n-type impurity layers n1 through n4 may be collected in the n+ wall 25. The n+ wall 25 may be a transport path for the electrons formed in the multi-well.

The photodiode 20 may be formed by epitaxial growth, or by implanting an n-type impurity in a p-type silicon substrate. FIG. 3 illustrates a stack of the p-type impurity layers and the n-type impurity layers around the photodiode 20 which may be formed in the process of forming the photodiode 20 by epitaxial growth. The p-type wall 40 may be a region for separating the photodiode 20 from the floating diffusion region 30. The p-type wall 40 in FIG. 3 may be formed by implanting a p-type impurity, but example embodiments may not be limited thereto. If the photodiode 20 is formed by implanting an n-type impurity in a p-type silicon substrate, the p-type silicon substrate may be used as the p-type wall 40. In the n-type impurity layer, the n+ wall 25, and the n++ floating diffusion region 30, the concentration of an n-type impurity may sequentially increase within the order of about $10^{16} \sim 10^{21}$, and may be formed by about 1 order difference.

A transfer gate 32 may be formed above the p-type wall 40. In FIG. 3, a dielectric layer may be omitted. When a predetermined or given voltage is applied to the transfer gate 32, the transfer transistor may be turned on and the electrons collected in the n+ wall 25 may migrate to the floating diffusion region 30 due to a potential energy difference. The transfer transistor may comprise the transfer gate 32, the floating diffusion region 30, and the photodiode 20. Although not shown in FIGS. 2 and 3, the multi-well CMOS image sensor may further include a reset transistor, a drive transistor, and a selection transistor as signal processing devices on a side of the first photodiode 21.

Figure 5:
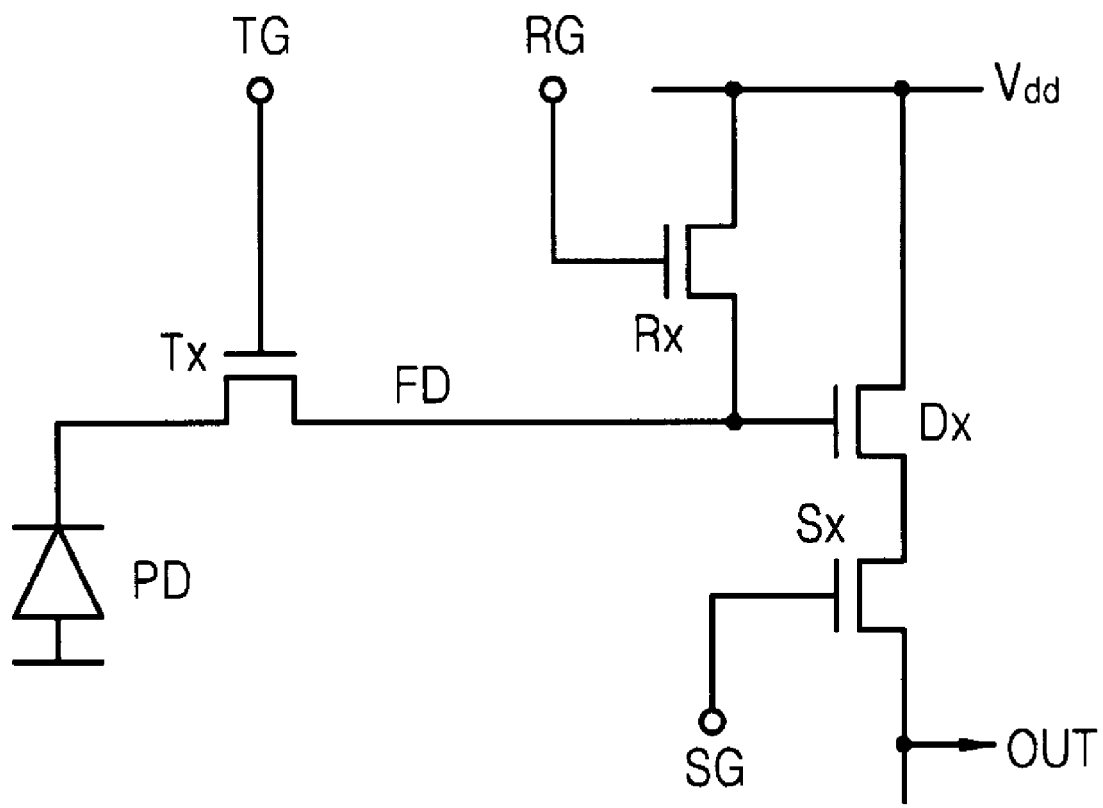

FIG. 5 is an equivalent circuit diagram of a unit pixel of a multi-well CMOS image sensor according to example embodiments. The unit pixel may be used as a blue pixel, a green pixel, and a red pixel. Referring to FIG. 5, a blue pixel of the multi-well CMOS image sensor may include a photodiode PD, a transfer transistor Tx, a reset transistor Rx, and a selection transistor Sx.

The photodiode PD may receive optical energy and may generate charges in response to the optical energy. The transfer transistor Tx may control the transfer of charges generated from the photodiode PD to a floating diffusion region FD by a transfer gate line TG. The reset transistor Rx may control an input voltage Vdd via a reset gate line RG and may reset a potential energy of the floating diffusion region FD. The drive transistor Dx may perform as a source follower amplifier. The selection transistor Sx may be a switching device that may select the unit pixel via a selection gate line SG. The input voltage Vdd may be outputted through an output line OUT through the drive transistor Dx and the selection transistor Sx.

Figure 6A:
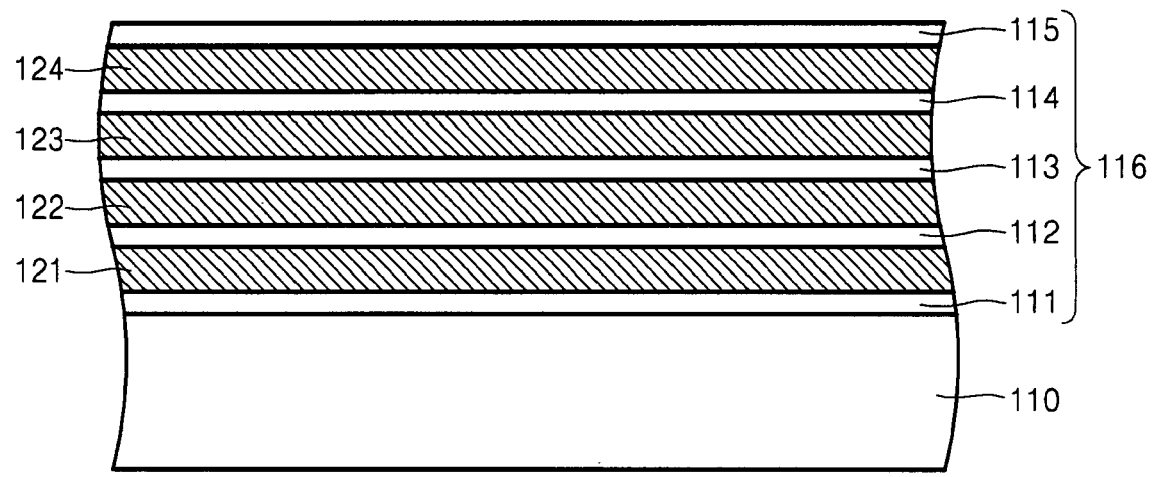
FIGS. 6A-6C are cross-sectional views illustrating a method of fabricating a multi-well CMOS image sensor according to example embodiments.
Figure 6B:
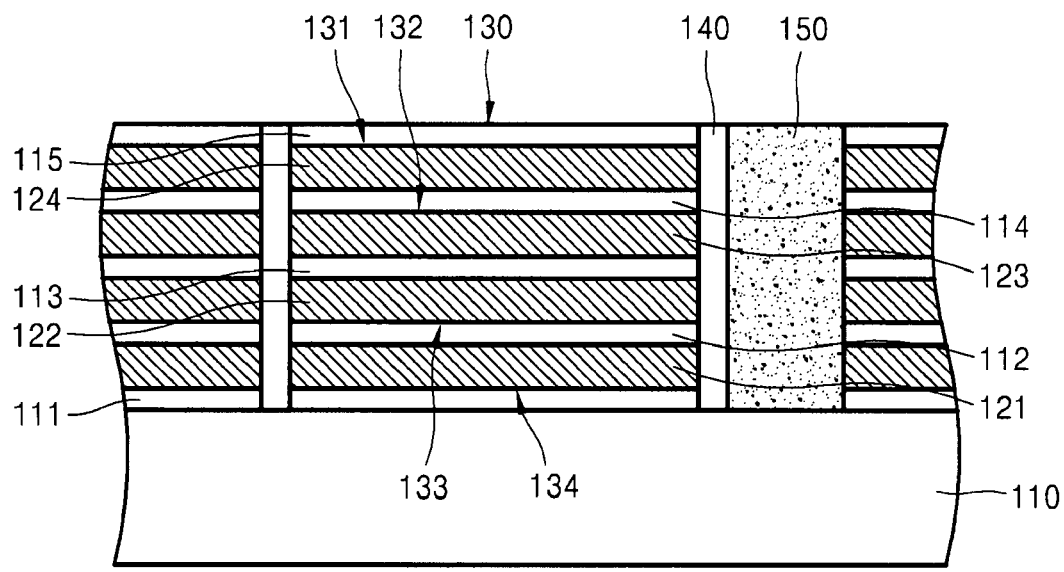
Figure 6C:
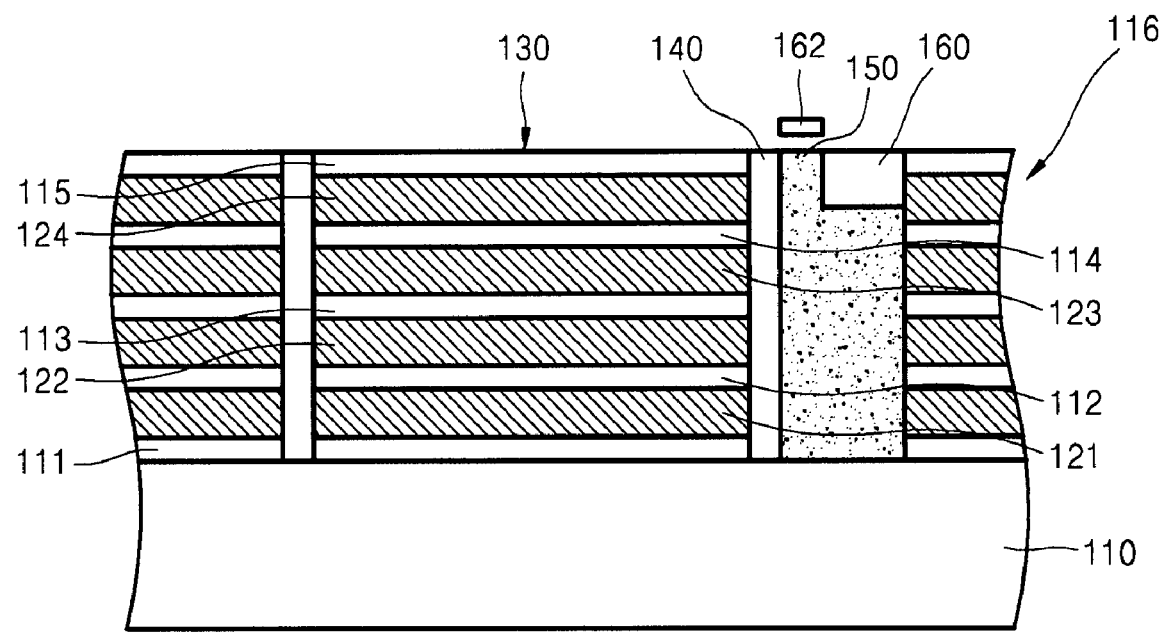

FIGS. 6A-6C are cross-sectional views illustrating a method of fabricating a multi-well CMOS image sensor according to example embodiments. Like reference numerals are used to indicate substantially identical elements, and thus, detailed descriptions thereof will not be repeated. Referring to FIG. 6A, an epitaxial silicon layer 116, in which a p-type impurity doping and an n-type impurity doping are alternately performed, may be formed on a substrate 110. The epitaxial layer 116 including first through fifth p-type impurity layers 111 through 115 and first through fourth n-type impurity layers 121 through 124, between the first through fifth p-type impurity layers 111 through 115, may be formed on the substrate 110. The substrate 110 may be a material having a lattice constant identical to that of the epitaxial layers, for example, a silicon substrate. The silicon epitaxial layer 116 may be formed using one silicon epitaxial process by changing the doping material.

Referring to FIG. 6B, n+ conductive ions may be implanted to define a photodiode region 130 by forming an n+ wall 140. The first through fourth n-type impurity layers 121 through 124 and p-type impurity regions around corresponding n-type impurity layers may form first through fourth photodiodes 131 through 134. The first through fourth photodiodes 131 through 134 may be pn junction diodes and may constitute a multi-potential well structure. P-type conductive ions may be implanted on a side of the n+ wall 140 to form a p wall 150. The p wall 150 may have a depth greater than that of the n+ wall 140, and thus, the migration of electrons gathered in the n+ wall 140 may be completely blocked.

Referring to FIG. 6C, a floating diffusion region 160 may be formed by implanting n++ conductive ions on a side of n+ wall 140. Although not shown in FIG. 6C, the electrode regions of the reset transistor, the drive transistor, and the selection transistor may be implanted with the n++ conductive ions. The n++ ion implantation may reduce the potential energy of the floating diffusion region 160 lower than that of the n+ wall 140, and thus, may allow the charges gathered in the n+ wall 140 to migrate to the floating diffusion region 160 due to the potential energy difference.

A dielectric layer (not shown) and a transfer gate 162 may be formed on the epitaxial layer 116. The transfer gate 162, the floating diffusion region 160, and a first photodiode 131 may constitute the transfer transistor. Electrode regions and gates of the reset transistor, the drive transistor, and the selection transistor may not be depicted in FIG. 6c. The fabrication of the dielectric layer, the gates, and the electrode regions may be performed using a well known CMOS process, and thus, the detailed description thereof will be omitted. In the above method, the n+ implantation process and the p-type impurity implantation process may be sequentially performed, however, example embodiments may not be limited thereto. For example, the p-type impurity implantation process may be performed prior to performing the n+ implantation process.

Figure 7A:
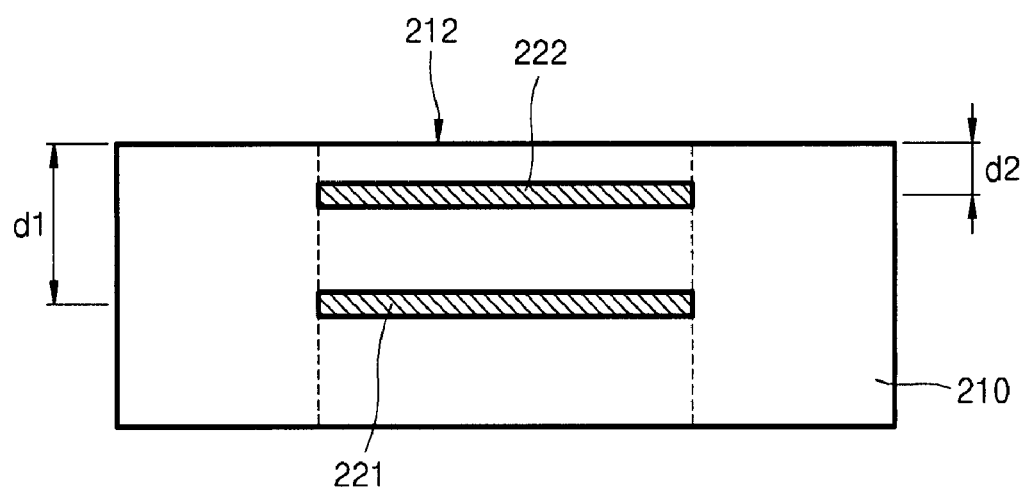
Figure 7B:
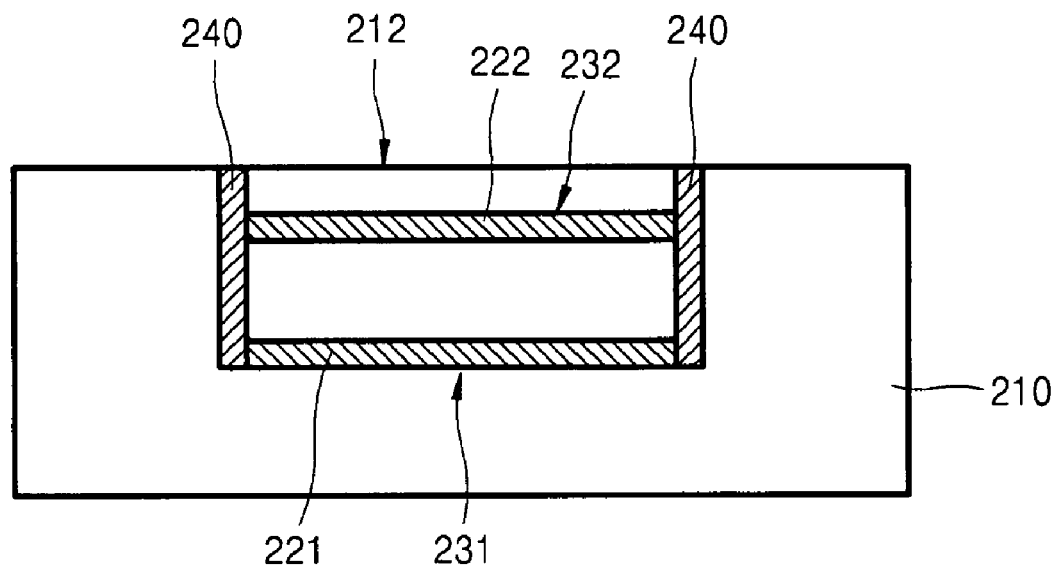
Figure 7C:
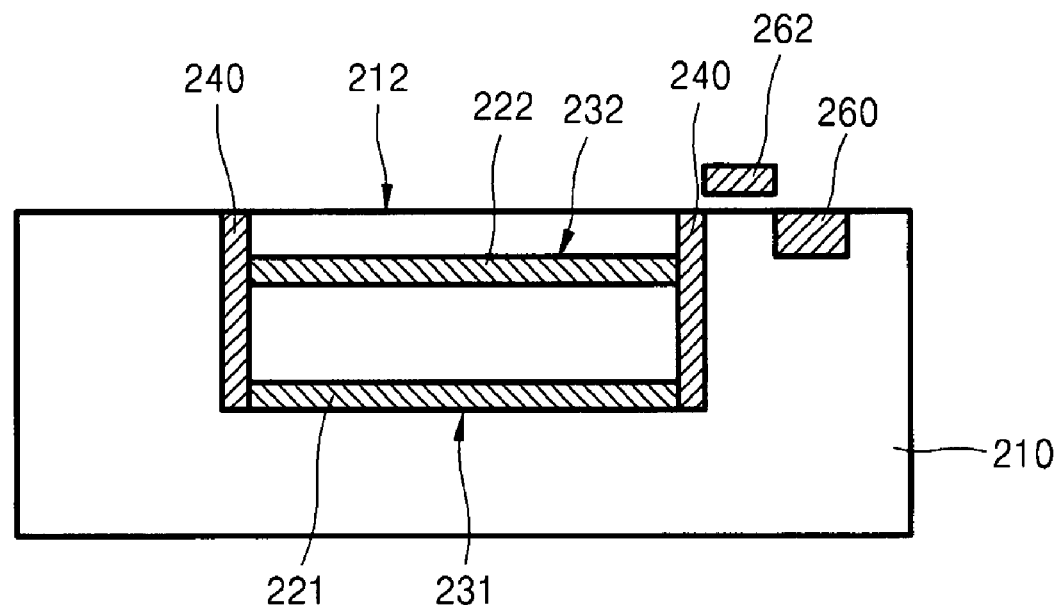

FIGS. 7A-7C are cross-sectional views illustrating a method of fabricating a multi-well CMOS image sensor according to example embodiments. Like reference numerals are used to indicate elements substantially identical to the elements, and thus, the detailed descriptions will not be repeated. Referring to FIG. 7A, a first n-type layer 221 may be formed in a photodiode forming region 212 having a first depth d1 from a surface of a p-type silicon substrate 210 by performing an n-type implantation. The region where the first n-type layer 221 is formed may be substantially the same as the photodiode forming region 212.

A second n-type layer 222 having a second depth d2 may be formed above the first n-type layer 221 by performing an n-type implantation from the surface of the substrate 210. The region where the second n-type layer 222 is formed may be the same region as the first n-type layer 221. The depths of the first n-type layer 221 and the second n-type layer 222 may be controlled by controlling the energy of the ion implantation. The first depth d1 may be about 2 μm or more, for example, about 3 μm or more. The first depth d1 may define the vertical volume of the photodiode, and may be formed in consideration of absorbing red light. In FIG. 7A, for convenience of explanation, only two n-type layers may be depicted, however, more than two n-type layers may be formed in a vertical direction.

Referring to FIG. 7B, an n+ wall 240 may be formed on an outer circumference of the photodiode forming region 212 by performing an n+ ion implantation. The first n-type layer 221 and the second n-type layer 222 may respectively form a first photodiode 231 and a second photodiode 232 together with the p-type silicon substrate region. The first and second photodiodes 231 and 232 respectively may be pn junction diodes, and the first and second photodiodes 231 and 232 may constitute a multi-potential well structure.

Referring to FIG. 7C, a floating diffusion region 260 may be formed on the substrate 210 by implanting n++ conductive ions. Although not shown in FIG. 7C, electrode regions of a reset transistor, a drive transistor, and a selection transistor may be formed by performing an n++ implantation process. The n++ ion implantation in the substrate 210 may reduce the potential energy of the floating diffusion region 260 lower than that of the n+ wall 240, and thus, may allow the charges gathered in the n+ wall 240 to migrate to the floating diffusion region 260 due to the potential energy difference.

A dielectric layer (not shown) may be formed on the substrate 210, and a transfer gate 262 and a gate of the reset transistor, the drive transistor, and the selection transistor may be formed. The fabrication of the dielectric layer and the gates may be performed using a well known CMOS process, and thus, the detailed description thereof will be omitted. In the above method, the n implantation process, the n+ implantation process, and the n++ implantation process may be sequentially performed, however, example embodiments may not be limited thereto. For example, the sequence of the implantation processes may be altered.

According to the method depicted in FIGS. 7A-7C, a multi-well CMOS image sensor may be fabricated by changing masks (not shown) and by controlling the implantation concentration of the n-type ions because a p-type silicon substrate may be used. As described above, in a multi-well CMOS image sensor according to example embodiments, a plurality of photodiodes, which are pn junction diodes, may be vertically formed in one photodiode region. Therefore, the vertical volume of the photodiode may be increased, thereby increasing detection efficiency of light having a relatively short wavelength. Thus, the sensitivity and dynamic range of the image sensor may be increased.

According to the method of fabricating a multi-well CMOS image sensor of example embodiments, a relatively deep photodiode region may be formed by a single epitaxial process, and thus, the multi-well CMOS image sensor may be formed by a simpler fabricating process.

While example embodiments have been particularly shown and described with reference to example embodiments thereof, it will be understood by those of ordinary skill in the art that various changes in form and details may be made therein without departing from the spirit and scope of the following claims.

What is claimed is:

1. A multi-well CMOS image sensor comprising:
a plurality of photodiodes having a multi-potential well structure vertically stacked in a region of a substrate;
an n+ wall directly and vertically connected to an outer circumference of the photodiodes;
a floating diffusion region on a side of the n+ wall opposite the photodiodes, the floating diffusion region configured to receive charges from the photodiodes; and
a p-type region between the floating diffusion region and the n+ wall.

2. The multi-well CMOS image sensor of claim 1, wherein each of the plurality of photodiodes is a pn junction diode having an n-type impurity layer and a p-type impurity layer on each horizontal side of the n-type impurity layer.

3. The multi-well CMOS image sensor of claim 1, wherein the n+ wall surrounds the outer circumference of the plurality of photodiodes.

4. The multi-well CMOS image sensor of claim 1, wherein the plurality of photodiodes have a depth of about 2 μm or more from the substrate.

5. The multi-well CMOS image sensor of claim 4, wherein the plurality of photodiodes have a depth of about 3 μm or more from the substrate.

6. The multi-well CMOS image sensor of claim 1, wherein the p-type region is a p-type wall formed using an implantation process.

7. The multi-well CMOS image sensor of claim 2, wherein the n-type impurity layers are formed by an ion implantation process.

8. A method of fabricating the multi-well CMOS image sensor of claim 1, comprising:
forming an epitaxial layer in which a plurality of p-type impurity layers and n-type impurity layers are alternately formed on the substrate;
forming the n+ wall on an outer circumference of a photodiode region by ion implanting an n+ impurity from an upper side of the epitaxial layer;
forming a p-type wall on the side of the n+ wall from a surface of the epitaxial layer to face the photodiode region by ion implanting p-type conductive ions from a surface of the epitaxial layer; and forming the floating diffusion region on the p-type wall by implanting n++ ions.

9. The method of claim 8, wherein the epitaxial layer is a silicon layer.

10. The method of claim 8, wherein the forming of the n+ wall includes forming the n+ wall to surround the outer circumference of the photodiode region.

11. The method of claim 8, wherein the forming of the p-type wall includes forming the p-type wall to have a depth greater than that of the n+ wall.

12. The method of claim 8, wherein the forming of the epitaxial layer includes forming the epitaxial layer with a depth of about 2 μm or more.

13. The method of claim 12, wherein the forming of the epitaxial layer includes forming the epitaxial layer with a depth of about 3 μm or more.

14. A method of fabricating the multi-well CMOS image sensor of claim 1, comprising:
forming a plurality of n-type impurity layers vertically separated from each other in a photodiode region from a surface of the p-type substrate, the substrate being a p-type substrate;
forming the n+ wall on an outer circumference of the photodiode region by ion implanting an n+ impurity from an upper side of the substrate; and
forming the floating diffusion region apart from Hall the side of the n+ wall to face the photodiode region by implanting n++ ions into the p-type substrate.

15. The method of claim 14, wherein the substrate is a silicon substrate.

16. The method of claim 14, wherein the forming of the plurality of n-type impurity layers includes implanting n-type ions.

17. The method of claim 14, wherein the forming of the n+ wall includes forming the n+ wall to be connected to the plurality of n-type impurity layers.

18. The method of claim 14, wherein the forming of the n+ wall includes forming the n+ wall to surround the outer circumference of the photodiode region.

19. The method of claim 14, wherein the forming of the plurality of n-type impurity layers includes forming the n-type impurity layers to a depth of about 2 μm or more.

20. The method of claim 19, wherein the forming of the plurality of n-type impurity layers includes forming the n-type impurity layers to a depth of about 3 μm or more.

* * * * *